United States Patent
Carley et al.

(10) Patent No.: US 7,208,991 B2
(45) Date of Patent: Apr. 24, 2007

(54) DIGITALLY PROGRAMMABLE DELAY CIRCUIT WITH PROCESS POINT TRACKING

(75) Inventors: Adam L. Carley, Windham, NH (US); Daniel J. Allen, Derry, NH (US); James E. Mandry, N. Andover, MA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 11/044,315

(22) Filed: Jan. 28, 2005

(65) Prior Publication Data

US 2006/0170482 A1   Aug. 3, 2006

(51) Int. Cl.
*H03L 7/06* (2006.01)

(52) U.S. Cl. .................. 327/158; 327/161; 327/278
(58) Field of Classification Search ............... 327/158, 327/161, 276, 278
See application file for complete search history.

(56) References Cited

U.S. PATENT DOCUMENTS

| | | | | |
|---|---|---|---|---|
| 5,039,893 A * | 8/1991 | Tomisawa | ................ | 327/276 |
| 5,111,085 A * | 5/1992 | Stewart | ................ | 327/278 |
| 5,359,301 A * | 10/1994 | Candage | ................ | 331/57 |
| 5,949,268 A * | 9/1999 | Miura et al. | ................ | 327/278 |
| 6,150,862 A * | 11/2000 | Vikinski | ................ | 327/262 |
| 6,373,312 B1 * | 4/2002 | Barnes et al. | ................ | 327/261 |
| 6,377,094 B1 | 4/2002 | Carley | | |
| 6,404,258 B2 * | 6/2002 | Ooishi | ................ | 327/278 |
| 6,489,823 B2 * | 12/2002 | Iwamoto | ................ | 327/158 |
| 6,518,811 B1 * | 2/2003 | Klecka, III | ................ | 327/276 |
| 6,573,777 B2 * | 6/2003 | Saint-Laurent et al. | ..... | 327/276 |
| 6,664,832 B2 | 12/2003 | Carley | | |
| 6,771,105 B2 * | 8/2004 | Andrasic et al. | ............ | 327/276 |
| 6,836,166 B2 * | 12/2004 | Lin et al. | ................ | 327/158 |
| 6,859,082 B2 * | 2/2005 | Tang | ................ | 327/276 |

* cited by examiner

Primary Examiner—Kenneth B. Wells
(74) Attorney, Agent, or Firm—Edell, Shapiro & Finnan, LLC

(57) ABSTRACT

A digitally programmable delay circuit comprising a plurality of transistors connected in parallel with each other and to a line carrying a signal having an edge to be delayed. One or more of the transistors are selected by a delay control signal to impose a delay amount to the edge, wherein the delay control signal is based on a desired delay amount and a measure of instantaneous process, voltage and temperature conditions of an integrated circuit in which the plurality of transistors are implemented. A selector circuit is responsive to the delay control signal and converts the delay control signal into one or more transistor selection signals to activate one or more of the plurality of transistors. The plurality of transistors may comprise a first sub-circuit having a plurality of transistors of a first type (e.g., P-type) connected in parallel with each other in a ladder configuration, and a second sub-circuit comprising a plurality of transistors of a second type (e.g., N-type) connected in parallel with each other and in a ladder configuration. The overall delay imposed on the edge after it has passed through both sub-circuits has delay contributions from both types of transistors. The delay circuit may have enhanced performance because of finer delay control granularity by providing a first circuit stage that comprises a plurality of transistors for relatively fine delay adjustment to the edge and a second circuit stage that comprises a plurality of transistors for relatively coarse delay adjustment to the edge. A combination of one or more of the transistors in the first and second circuit stages may be selected to produce numerous steps or increments of delay adjustability.

17 Claims, 5 Drawing Sheets

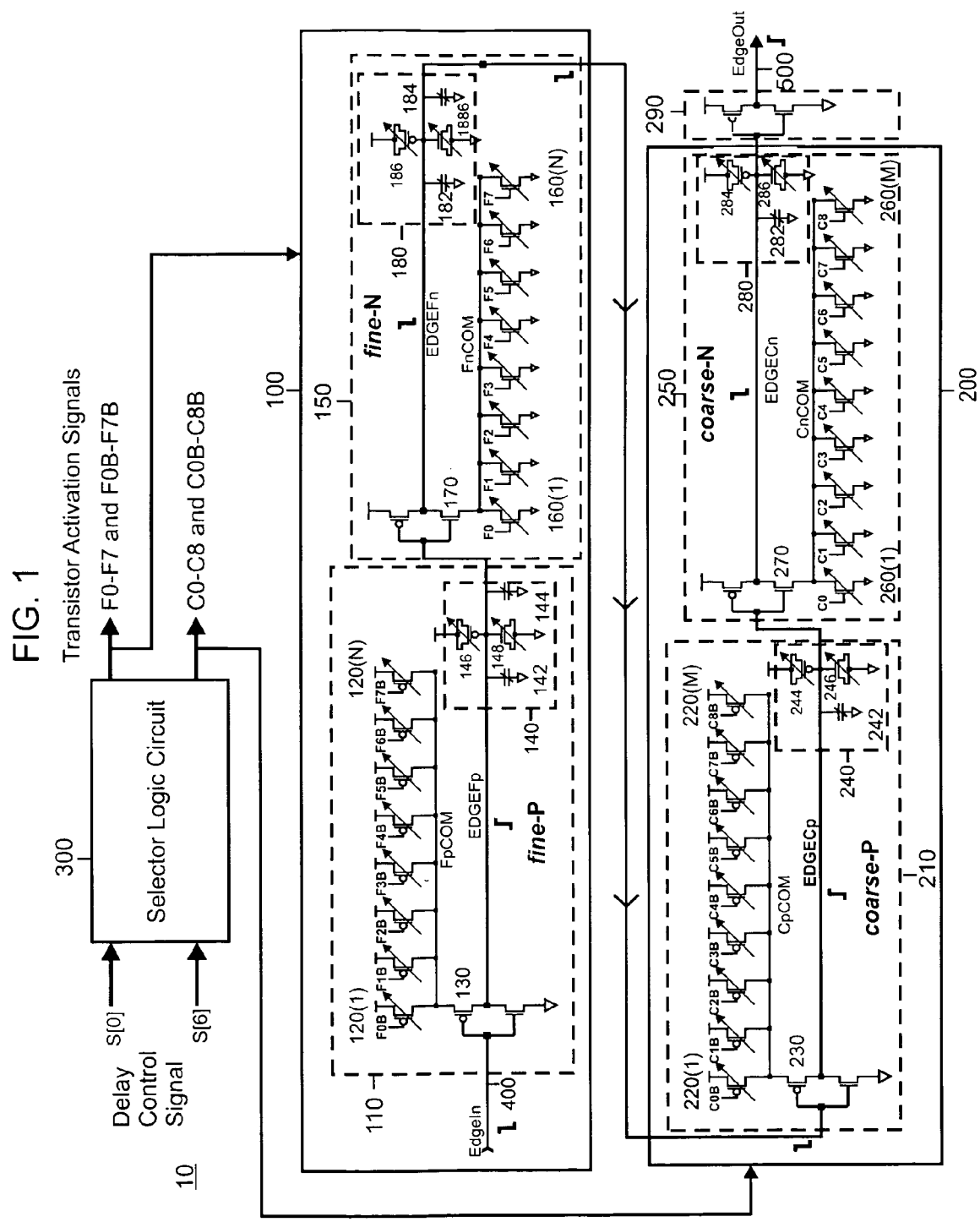

FIG. 2A

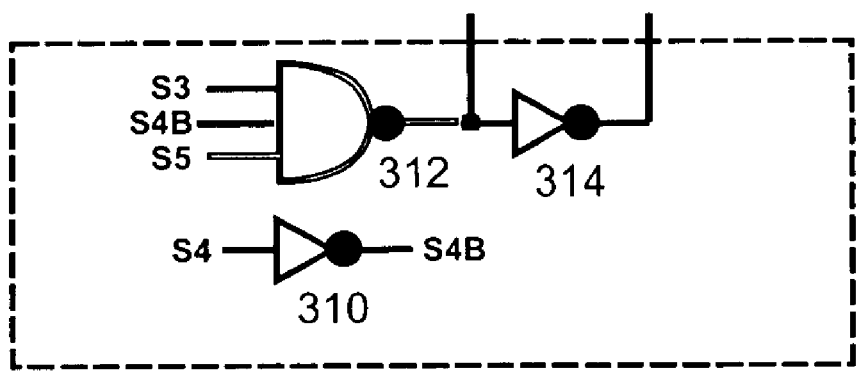

Portion of 300

FIG. 2B

FINE selector code:

F0 = $\overline{S2} \cdot \overline{S1} \cdot \overline{S0}$
F1 = $\overline{S2} \cdot \overline{S1} \cdot S0$
F2 = $\overline{S2} \cdot S1 \cdot \overline{S0}$
F3 = $\overline{S2} \cdot S1 \cdot S0$
F4 = $S2 \cdot \overline{S1} \cdot \overline{S0}$
F5 = $S2 \cdot \overline{S1} \cdot S0$
F6 = $S2 \cdot S1 \cdot \overline{S0}$
F7 = $S2 \cdot S1 \cdot S0$ COARSE selector code:

C0 = $\overline{S5} \cdot \overline{S4} \cdot \overline{S3} \cdot \overline{S6}$
C1 = $\overline{S5} \cdot \overline{S4} \cdot S3$
C2 = $\overline{S5} \cdot S4 \cdot \overline{S3}$
C3 = $\overline{S5} \cdot S4 \cdot S3$
C4 = $S5 \cdot \overline{S4} \cdot \overline{S3}$
C5 = $S5 \cdot \overline{S4} \cdot S3$
C6 = $S5 \cdot S4 \cdot \overline{S3}$
C7 = $S5 \cdot S4 \cdot S3$
C8 = $S6$

DIGITALLY PROGRAMMABLE DELAY CIRCUIT WITH PROCESS POINT TRACKING

This application is related to commonly assigned co-pending U.S. application Ser. No. 11/044,336 filed on even date an entitled "Delay Circuit for Synchronizing Arrival of a Clock Signal at Different Circuit Board Points," the entirety of which is incorporated herein by reference.

BACKGROUND OF THE INVENTION

This invention relates to a digitally programmable delay control circuit.

Commonly assigned U.S. Pat. Nos. 6,377,094 and 6,664,832, entitled "Arbitrary Waveform Synthesizer Using a Free-Running Oscillator" disclose a digitally controlled arbitrary waveform synthesizer having a ring oscillator that provides a short-term stable time reference. A plurality of taps are provided to select edges (transitions) produced by the ring oscillator. In the arbitrary waveform synthesizer, a delay circuit is used to provide finer timing granularity for edge generation than one tap of the ring oscillator.

In signal generation applications, such as clock signal generation, the integrated circuit in which the signal generation circuitry is implemented may have undesirable variations or delays as a function of process, temperature and voltage. Most on-chip delay originates as transistor-sourced currents charging wiring and gate capacitances. This delay variation can span a range of more than 2.5:1. Such a range of delay uncertainty is unacceptable for certain applications where timing precision is critical. Existing efforts to deal with this delay uncertainty attempt to minimize the process variation on the chip, rather than measuring and correcting for it.

A programmable delay circuit is needed that is capable of precisely tracking variations in delays caused by process, temperature and voltage conditions of the integrated circuit.

SUMMARY OF THE INVENTION

Briefly, a digitally programmable delay circuit is provided comprising a plurality of transistors connected in parallel with each other and to a line carrying a signal having an edge to be delayed. One or more of the transistors are selected by a delay control signal to impose a delay amount to the edge, wherein the delay control signal is based on a desired delay amount and a measure of instantaneous process, voltage and temperature conditions of an integrated circuit in which the plurality of transistors are implemented. A selector circuit is responsive to the delay control signal and converts the delay control signal into one or more transistor selection signals to activate one or more of the plurality of transistors. The circuit topologies described herein have extremely good delay linearity but are also tunable to achieve the same degree of linearity in nearly any CMOS technology.

The plurality of transistors may comprise a first sub-circuit having a plurality of transistors of a first type (e.g., P-type) connected in parallel with each other in a ladder configuration, and a second sub-circuit comprising a plurality of transistors of a second type (e.g., N-type) connected in parallel with each other and in a ladder configuration. The overall delay imposed on the edge after it has passed through both sub-circuits has delay contributions from both types of transistors. By imposing the delay on the edge using transistors of both types, better tracking with respect to the process, voltage and temperature conditions of the integrated circuit on which the delay circuit is implemented can be achieved.

One of the problems as semiconductor fabrication technologies advance (become more miniaturized) is a long term drift of P-type and N-type device thresholds. The techniques described herein of passing a specific rising/falling edge through banks of sized P-type and N-type devices to track process, temperature, and voltage variations will also serve to track long term P-type and N-type threshold drifts.

Further, the delay circuit may have enhanced performance because of finer delay control granularity by providing a first circuit stage that comprises a plurality of transistors for relatively fine delay adjustment to the edge and a second circuit stage that comprises a plurality of transistors for relatively coarse delay adjustment to the edge. A combination of one or more of the transistors in the first and second circuit stages may be selected to produce numerous steps or increments of delay adjustability.

Other objects and advantages will become more apparent when reference is made to the following description taken in conjunction with the accompanying drawings.

BRIEF DESCRIPTION OF THE DRAWINGS

FIG. 1 is a schematic diagram of a digitally programmable delay circuit.

FIG. 2A is a schematic diagram of a portion of a selector logic circuit shown in FIG. 1 forming a part of the digitally programmable delay circuit.

FIG. 2B illustrates the Boolean algebra relationships that are implemented by the selector logic circuit.

DETAILED DESCRIPTION

Figure 3:
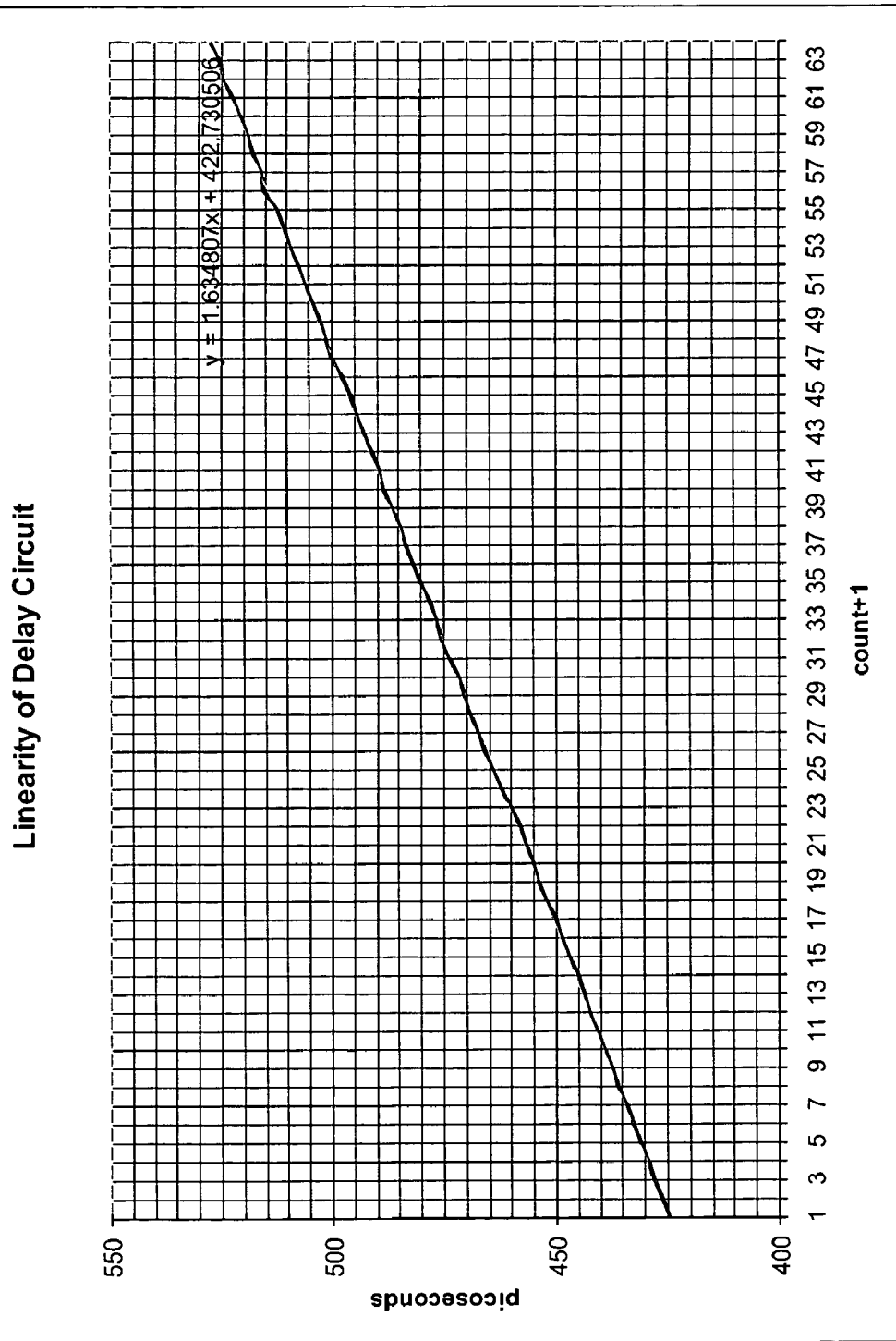
FIG. 3 is a plot showing the linearity of the digitally programmable delay circuit.

Referring first to FIG. 1, a digitally programmable delay circuit is shown at reference numeral 10. The circuit 10 comprises a first and second circuit stages 100 and 200 and a selector logic circuit 300. The first and second circuit stages 100 and 200 are connected to each other in series, and one of the first and second circuit stages 100 and 200 is connected to a line 400 that carries a signal having an edge to be delayed. The edge to be delayed is referred to as EdgeIn in FIG. 1 and is shown as a falling edge but the techniques described herein are also applicable to delaying a rising edge of a signal. The first and second circuit stages 100 and 200 may be connected such that either the first or second circuit stage is connected first to the line 400. The output of the circuit 10 is output line 500. One of the circuit stages has a plurality of transistors that are sized such that one or more of the transistors are selectively activated to provide relative fine control of the delay amount imposed to the edge. The other circuit stage has a plurality of transistors that are sized such that one or more of the transistors are selectively activated to provide relative coarse control of the delay amount to the edge. For example, as shown in FIG. 1, the first circuit stage 100 is dedicated to relative fine delay control and the second circuit stage 200 is dedicated to relative coarse delay control. Said another way, selection of the transistors is made such that one or more transistors of a first sub-set of the plurality of transistors dedicated to relatively fine adjustable amount of delay are selected (first circuit stage) to delay the edge and one or more transistors of a second sub-set of the plurality of transistors dedicated to relatively coarse adjustable amount of delay are selected (second circuit stage) to delay the edge.

It should be understood that while two circuit stages are shown for fine and coarse delay control, the delay circuit concepts may be applied to a single circuit stage that would provide a single degree of delay control.

The circuit 10 is responsive to a delay control signal(s) in the form of a digital selection code S[0:6], e.g., a 7-bit code. The selector logic circuit 300 comprises digital logic, described hereinafter in conjunction with FIG. 2, which generates transistor selection signals to the first and second circuit stages 100 and 200. The transistor selection signals comprise a fine (first) selection code F0–F7 and F0B–F7B that is coupled to the first circuit stage 100, and a coarse (second) selection code C0–C8 and C0B–C8B that is coupled to the second circuit stage 200. The annotation "B" on these signal labels indicates the binary "complement". For example, F1B is the complement of F1. The digital selection code essentially selects one or more transistors in the first circuit stage for relatively fine delay adjustment and one or more transistors in the second circuit stage for relatively coarse delay adjustment.

It should be understood that while only two circuit stages are described herein for coarse and fine control, three or more circuit stages may be provided wherein a relatively different degree of delay adjustment control is provided by each circuit stage.

Each of the circuit stages 100 and 200 comprises first and second sub-circuits. The first sub-circuit comprising a plurality of transistors of a first type (e.g., P-type transistors) and the second sub-circuit comprises a plurality of transistors of a second type (e.g., N-type transistors). Consequently, delay to an edge is imposed with both P-type and N-type transistors (in series) to better track variations for both P-type and N-type transistors on the integrated circuit. Delay to the edge may be first imposed by one or more of the P-type transistors and subsequently imposed by one or more of the N-type transistors, or vice versa. The point is that the circuit elements imposing the delay may consist of transistors of both types, so that the overall delay imposed on the edge after it has passed through both sub-circuits has delay contributions from both types of transistors. By imposing the delay on the edge using transistors of both types, better tracking with respect to the process, voltage and temperature conditions of the integrated circuit on which the delay circuit is implemented can be achieved.

Specifically, the first circuit stage 100 comprises a first sub-circuit 110 having a plurality of P-type transistors 120(1) to 120(N) connected in parallel with each other in a ladder configuration. A switching transistor 130 and a capacitive load 140 are provided. The capacitive load 140 comprises metal trace capacitors 142 and 144 and active capacitors 146 and 448. An active capacitor, as is known in the art, comprises a transistor having its drains and sources shorted. An active capacitor contributes a relatively large degree of capacitance (per area) to the capacitive load 140 and is useful for tracking variations on the integrated circuit. For example, a ratio of the gate capacitance to wire capacitance of the active capacitors 146 and 148 may be set to match the tracking between the delay circuit and transistors of another circuit in the same integrated circuit. Active capacitor 146 is a P-type active capacitor and active capacitor 148 is an N-type active capacitor. In some applications, only an N-type active capacitor may be used because N-type transistors are smaller.

Each of the transistors 120(1) to 120(N) comprises a gate, drain and source. The drains of the transistors 120(1) to 120(N) are connected in common and to the source of the switching transistor 130. The capacitive load 140 is connected between a fixed potential (e.g., ground) and the drain of the switching transistor 130. The switching transistor 130 controls connection of one or more of the P-type transistors 120(1) to 120(N) that have been selected in the first sub-circuit 110 to the line 400 that carries the signal edge to be delayed.

The first circuit stage 100 comprises a second sub-circuit 150 having a plurality of N-type transistors 160(1) to 160(N) connected in parallel with each other in a ladder configuration. A switching transistor 170 and a capacitive load 180 are provided. The capacitive load 180 comprises metal trace capacitors 182 and 184, and active capacitors 186 and 188. Each of the transistors 160(1) to 160(N) comprises a gate, drain and a source. The drains of the transistors 160(1) to 160(N) are connected in common and to the source of the switching transistor 170. The capacitive load 180 is connected between a fixed potential (e.g., ground) and the drain of the switching transistor 170. The switching transistor 170 controls connection of one or more of the plurality of N-type transistors 160(1) to 160(N) that have been selected in the second sub-circuit 150 to a line carrying the intermediate delayed edge at the output of the first sub-circuit 110.

Similarly, the second circuit stage 200 comprises a first sub-circuit 210 having a plurality of P-type transistors 220(1) to 120(M) connected in parallel with each other in a ladder configuration. A switching transistor 230 and a capacitive load 240 are provided. The capacitive load 240 comprises a metal trace capacitor 242 and active capacitors 244 and 246. Each of the transistors 220(1) to 220(M) has a gate, drain and source. The drains of the transistors 220(1) to 220(M) are connected in common and to the source of the switching transistor 230. The capacitive load 240 is connected between a fixed potential (e.g., ground) and the drain of the switching transistor 230. The switching transistor 230 controls connection of one or more of the P-type transistors 220(1) to 220(M) that have been selected in the first sub-circuit 210 to a line carrying the intermediate delayed edge output by the first circuit stage 100.

The second circuit stage 200 comprises a second sub-circuit 250 having a plurality of N-type transistors 260(1) to 260(N) connected in parallel with each other in a ladder configuration. A switching transistor 270 and a capacitive load 280 are provided. The capacitive load 280 comprises a metal trace capacitor 282 and active capacitors 284 and 286. Each of the transistors 260(1) to 260(M) comprises a gate, drain and a source. The drains of the transistors 260(1) to 260(M) are connected in common and to the source of the switching transistor 270. The capacitive load 280 is connected between a fixed potential (e.g., ground) and the drain of the switching transistor 270. The switching transistor 270 controls connection of one or more of the plurality of N-type transistors 260(1) to 260(M) that have been selected in the second sub-circuit 250 to a line carrying the intermediate delayed edge output of the first sub-circuit 210 of circuit stage 200.

An output circuit stage 290 is provided comprising an inverter. The output circuit stage 290 is connected to the intermediate delayed edge output by the second sub-circuit of the second circuit stage 200, and supplies the delayed edge referred to as EdgeOut, on output line 500.

The P-type transistors in sub-circuit 110 and the N-type transistors in sub-circuit 150 of the first circuit stage 100 handle fine delay adjustment of the edge. The P-type transistors in sub-circuit 210 and the N-type transistors in sub-circuit 250 of the second circuit stage 200 handle coarse delay adjustment of the edge after it has been delayed by the first circuit stage.

In an exemplary implementation shown in FIG. 1, the two fine delay adjustment transistor ladder sub-circuits 110 and 150 each have eight transistors (N=8) associated with three lower order control bits S[0:2] of the digital delay control code S[0:2]. Similarly, the transistor ladder sub-circuits 210 and 250 each have nine transistors (M=9) associated with three higher order control bits S[3:6] plus a ninth coarse step to achieve a total of 72 delay adjustment steps or increments.

The width of each individual ladder transistor is carefully set to a certain precision (e.g., the finest precision allowed by the particular foundry). The effective width of a transistor approximately sets the current it will source when activated ON, and hence how fast the transistor will charge the load capacitance.

Some of transistors in each ladder sub-circuit have different effective widths so that certain transistors can contribute a different delay amount when activated. In one embodiment, each of the transistors in each ladder sub-circuit has a different effective width. For example, in sub-circuit 110 of the first circuit stage 100, the transistors 120(1) to 120(N) each have different respective effective widths that span a delay range in relatively fine increments or steps. Similarly, transistors 160(1) to 160(N) in the second sub-circuit 150 each have different respective effective widths that span a delay range in relatively fine increments in sub-circuit 110. Likewise, in sub-circuit 210 of the first circuit stage 200, the transistors 220(1) to 220(M) each have different respective effective widths that span a delay range in relatively coarse increments or steps. Similarly, transistors 260(1) to 260(M) in sub-circuit 250 each have different respective effective widths that span a delay range in relatively coarse increments or steps.

Delay through each transistor ladder sub-circuit is inversely proportional to the total transistor current, i.e., which is dependent on how many and which transistors in the ladder sub-circuit are activated. Therefore, the delay amount difference (step or increment) between two transistors in a transistor ladder sub-circuit is the difference between the reciprocals of the effective width of each transistor. The effective widths of the transistors in each transistor ladder sub-circuit may be set such that the reciprocals of the effective widths of the transistors are equally or unequally spaced when spanning the corresponding delay range for that transistor ladder sub-circuit. The actual transistors differ substantially from the ideal because turn-ON is not instantaneous and the switch transistors have finite ON resistance.

In one embodiment, one and only one transistor in each of the four transistor ladder sub-circuits 110, 150, 210 and 250 is ON (selected and activated) at a given time and all the other transistors in the respective ladder sub-circuits are held OFF. Moreover, in the first circuit stage 100, a transistor pair comprising a P-type transistor in the first sub-circuit 110 and a N-type transistor in the second sub-circuit 150 is ON or OFF together, as indicated by their gates of the corresponding P-type and N-type transistors being connected to complementary transistor selection signals. For example, in the first circuit stage 100, transistor 120(3) and transistor 160(3) are ON or OFF together. When transistor 120(3) is ON, transistors 120(1), 120(2) and 120(4)-120(N) are OFF. When transistor 160(3) is ON, transistors 160(1), 160(2) and 160(4) are OFF. Similarly, in the second circuit stage 200, a transistor pair comprising a P-type transistor in the first sub-circuit 210 and a N-type transistor in the second sub-circuit 250 are ON or OFF together, as indicated by the gates of the corresponding P-type and N-type transistors being connected to complementary transistor activation signals.

When a signal edge to be delayed is coupled to the circuit 10 on the line 400, the switching transistor for each sub-circuit connects the selected ladder transistor to the capacitive load of that sub-circuit and the charging begins. Since only one polarity edge is important at a given time, the active polarity alternates between the sub-circuits as indicated in FIG. 1.

One of the advantages of the circuit 10 shown in FIG. 1 is that it does not have very small capacitors or very small transistors. Two adjacent transistors in the fine ladder sub-circuits, for example, can be nearly equal. It would be impractical (and highly nonlinear) to make a transistor equal to the difference. Instead, the circuit turns one completely OFF when it is using the other.

Another advantage is that N-type and P-type transistor ladder sub-circuits are adjustable independently. Thus, it is possible to independently track N-type variations and P-type variations in the transistors of another important circuit on the same IC as the delay circuit 10.

FIG. 1 shows each of the capacitive loads may be adjusted (at design), not only as to value, but as to gate versus wire capacitance ratio. The purpose of this is to provide extra degrees of freedom for matching slow-P/slow-N (SS) to fast-P/fast-N (FF) tracking between the delay circuit 10 and the other circuit on the IC of importance. Another useful variable is the gate length of each ladder transistor. All ladder-transistor gate lengths are generally identical. However, the relative gate length between the ladder transistors in the delay circuit 10 and transistors in another circuit in the IC may be adjusted (at design) for controlling SS to FF tracking. For example, transistors in the other circuit in the IC may have a 0.25 micron gate length and transistors in the delay circuit 10 may have a 0.20 micron gate length to optimize their tracking.

Turning to FIGS. 2A and 2B, with continued reference to FIG. 1, the selector logic circuit 300 will be described. The selector logic circuit 300 is responsive to the delay control signal formed by bits S[0:6] and outputs the fine transistor selection code F0–F7 and F0B–F7B and the coarse transistor selection code C0–C8 and C0B–C8B. An example of the Boolean algebra relationship between the digital selection code S[0:6] and the fine and coarse transistor selection codes is shown in FIG. 2B. A portion of a digital logic circuit capable of computing this Boolean relationship with respect to the higher order selection bits S[3:5] is shown in FIG. 2A. The logic circuitry comprises a NAND gate 312 and inverter gates 310 and 314. Similar logic blocks are provided for each of the other coarse and fine transistor activation signals.

FIG. 3 is a plot showing linearity performance of the delay circuit 10 versus the amount of delay (delay count) imposed on the signal. The line shown in FIG. 3 is actually plots of both the desired linearity and the actual linearity performance of the delay circuit 10 over a range of 64 delay counts or increments. The actual linearity is nearly the same as the desired linearity.

Figure 4:
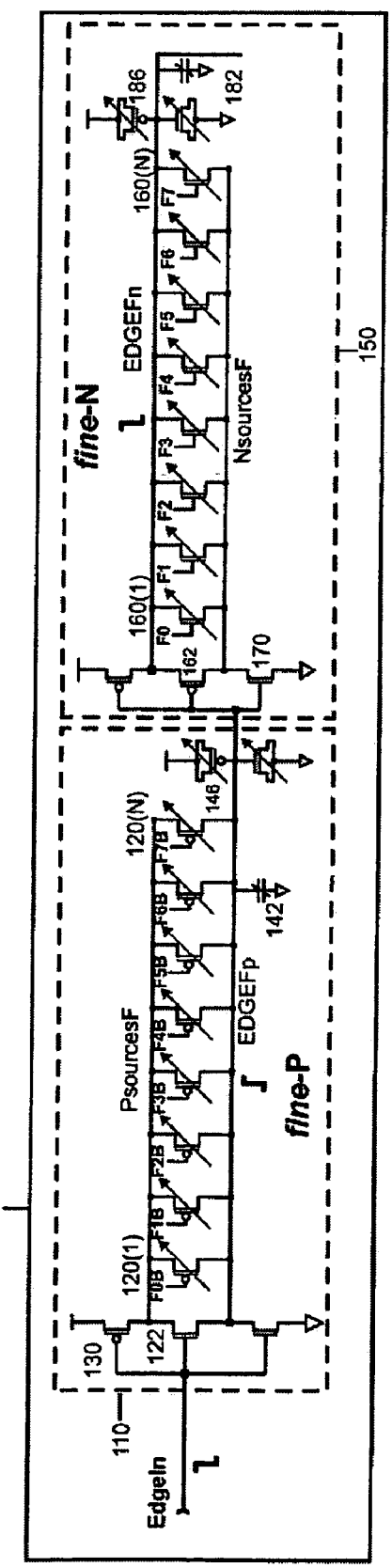
FIG. 4 is schematic diagram of an alternative topology of the digitally programmable delay circuit.

FIG. 4 illustrates one circuit stage (e.g., the first circuit stage 100) of the delay circuit 10 having an alternative topology to the circuit topology shown in FIG. 1. This alternative topology would be applied to both circuit stages, but for simplicity only one stage is shown. In FIG. 1, the switching transistors 130 and 170 for sub-circuits 110 and 150, respectively, are positioned in series with each ladder sub-circuit's calibrated parallel transistors "inside" between the associated transistor ladder and capacitive load. FIG. 4 illustrates a topology in which the transistor ladder and switching transistor are reversed. That is, in FIG. 4, in sub-circuit 110 the switching transistor 130 is connected outside the transistor ladder formed by transistors 120(1) to 120(N). The sources of the P-type transistors 120(1) to 120(N) are connected in common, and the drains of the P-type transistors 120(1) to 120(N) are connected in common. The capacitive load, comprised of metal trace capacitor 142 and an active capacitor 146, is connected between the commonly connected drains of the P-type transistors 120(1) to 120(N) and a fixed potential (e.g., ground). The switching transistor 130 is connected to the sources of the P-type transistors 120(1) to 120(N). In this configuration, the switching transistor 130 controls connection of one or more of the plurality of P-type transistors 120(1) to 120(N) that have been selected in the first sub-circuit 110 to a power rail.

The same is true for the switching transistor 170 in the sub-circuit 150. In this case, the sources of the N-type transistors 160(1) to 160(N) are connected in common and the drains of the N-type transistors 160(1) to 160(N) are connected in common. A capacitive load, comprised of metal trace capacitor 182 and an active capacitor 186, is connected between a fixed potential (e.g., ground) and the drains of the N-type transistors 160(1) to 160(N). The switching transistor 170 is connected to the commonly connected sources of the N-type transistors 160(1) to 160(N) and controls connection of one or more of the plurality of N-type transistors 160(1) to 160(N) that have been selected in the second sub-circuit 110 to a fixed potential (e.g., ground).

In the topology of FIG. 4, the switching transistors 130 and 170 are driven at full gate-to-source switching voltage and therefore switch "harder" and more cleanly.

Another topology variation shown in FIG. 4 is the additional of an extra transistor 122 and 162 connected to the end of each transistor ladder in sub-circuits 110 and 150, respectively. The extra transistors 122 and 162 are reverse polarity of the rest of the ladder transistors. For example, transistor 122 is an N-type transistor connected at one end of the ladder of P-type transistors 120(1) to 120(N), and in parallel with the P-type transistors 120(1) to 120(N). Similarly, transistor 162 is a P-type transistor connected at one of the ladder of N-type transistors 160(1) to 160(N), and in parallel with the N-type transistors 160(1) to 160(N).

Transistors 122 and 162 are called "snubber" transistors. The purpose of the snubber transistors is to fully discharge the voltage across the corresponding transistor ladder during its inactive portion of the signal for that transistor ladder. Otherwise, the voltage across a transistor ladder will only decay until it reaches threshold voltage and the busses marked PsourcesF and NsourcesF will be left floating for the rest of the cycle. For example, the snubber transistor 112 will discharge the voltage across the P-type transistors 120(1) to 120(N) during the low portion of the signal. Similarly, the snubber transistor 162 will discharge the voltage across the N-type transistors 160(1) to 160(N) during a high portion of the signal. Of course, without the snubber transistors the ladder transistors may be adjusted to produce the desired timing. Thus, the snubber transistors are an optional feature.

Figure 5:
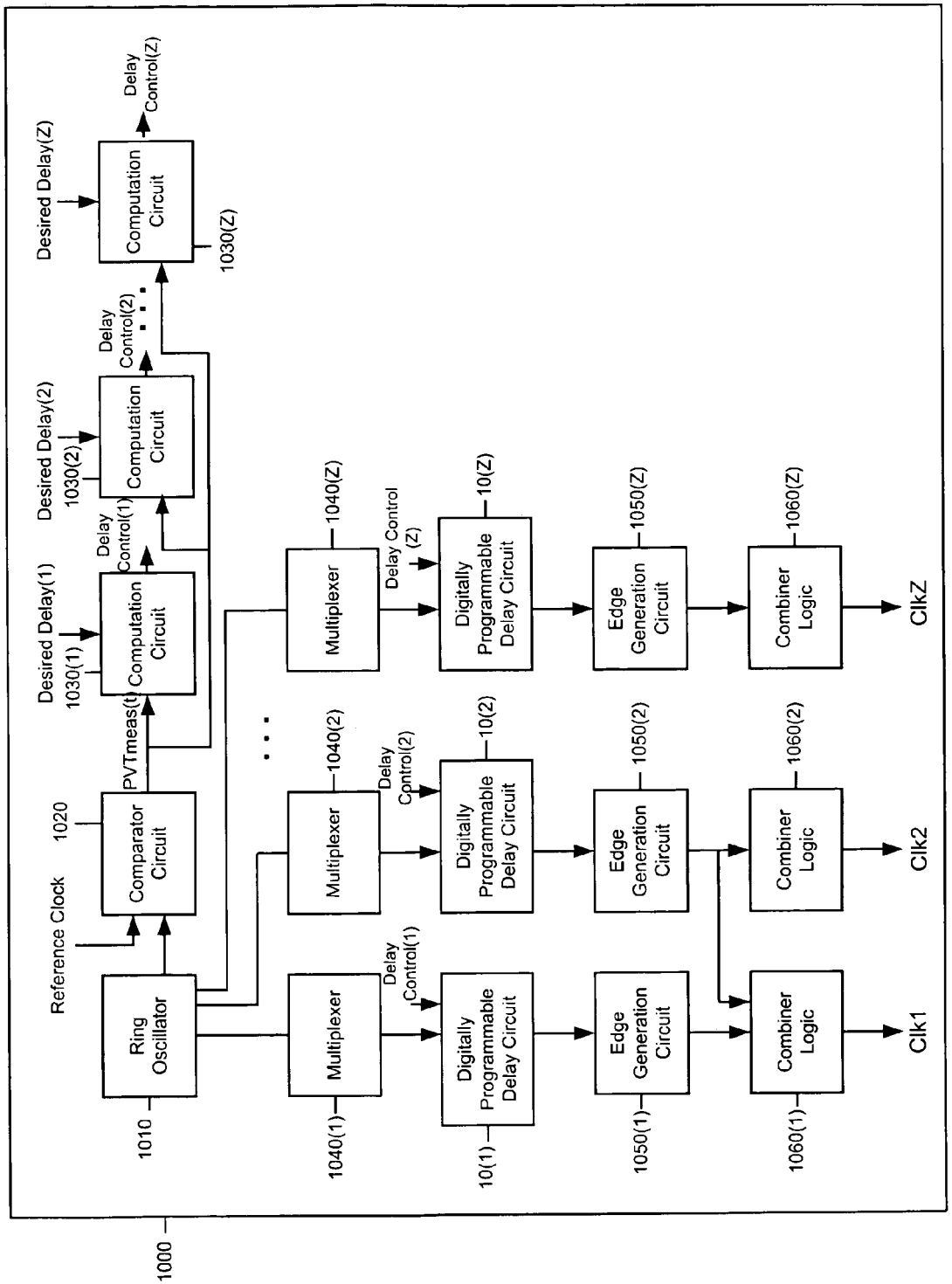
FIG. 5 is a block diagram showing one application of the digitally programmable delay circuit in a clock signal generation system.

FIG. 5 illustrates one application of the delay circuit 10 in a clock system 1000 that is implemented in a single integrated circuit chip as indicated by the dotted line around the system 1000. The clock system 1000 comprises a ring oscillator circuit 1010 that generates a plurality of uniquely phased oscillator transition signals from which a clock signal is generated. The ring oscillator circuit 1010 is an example of a circuit with respect to which tracking of the delay circuit 10 is to be made. The ring oscillator circuit 1010 is connected to a comparator circuit 1020 that receives as input a reference clock signal (such as a signal from a crystal). The comparator circuit 1020 compares a speed of the ring oscillator circuit 1010 with the reference signal and generates a tracking value PVTmeas(t) that is a measure of the instantaneous process, voltage and temperature conditions of the integrated circuit in which the system 1000 is implemented. For each delay circuit 10(1) to 10(Z) in the clock system 1000 there is a corresponding computation circuit 1030(1) to 1030(Z). Each computation circuit 1030(1) to 1030(Z) is coupled to the comparator circuit 1020 and generates a corresponding delay control signal (1) to (Z) (e.g., multiple sets of delay selection bits S[0:6] based on the tracking value PVTmeas(t) generated by the comparator circuit 1020 and a desired delay for the corresponding delay circuit 10(1) to 10(Z).

One application of the delay circuit 10 in the clock system 1000 is in conjunction with an arbitrary frequency synthesizer system disclosed in commonly assigned U.S. Pat. Nos. 6,377,094 and 6,664,832, entitled "Arbitrary Waveform Synthesizer Using a Free-Running Oscillator". The entirety of each of these patents is incorporated herein by reference. In those patents, the ring oscillator circuit 1010 is described as part of the arbitrary frequency synthesizer and is the component that generates the edge transitions from which one or more clock signals may be generated at an arbitrary desired frequency. When the delay circuit described herein is applied to the system shown in FIG. 6, the delay circuit is employed to provide finer timing granularity for edge generation than a single "tap" of the ring oscillator circuit 1010. The ring oscillator circuit 1010 provides the short-term-stable time reference for the frequency synthesizing process. A tap spacing on the ring oscillator circuit 1010 ranges from roughly 50 to 200 picoseconds depending on design and process/voltage/temperature (PVT) conditions of the integrated circuit chip in which the ring oscillator is implemented. The delay circuit 10 essentially divides a ring oscillator tap into 64 parts or delay increments.

The clock system 1000 generates a plurality of clock signals in a plurality of processing channels 1 to Z. In each processing channel, there is a corresponding multiplexer 1040(1) to 1040(Z), a corresponding digitally programmable delay circuit 10(1) to 10(Z), a corresponding edge generation circuit 1050(1) to 1050(Z) and a corresponding combiner logic circuit 1060(1) to 1060(Z). The delay control signals (1) to (Z) are supplied as control inputs to a corresponding one of the delay circuits 10(1) to 10(Z) to adjust the delay of the output of the multiplexer in the corresponding processing channel before coupling of the signal to the edge generation circuit. The edge generation circuit, is for example, a J-K Flip Flop circuit, and produces an edge based on the output of the delay control circuit. Thus, each delay circuit 10(1) to 10(Z) is supplied a different delay control signal depending on the corresponding desired delay amount for that delay circuit and the tracking value PVTmeas(t).

By comparing the ring oscillator circuit speed to a reference signal, a highly accurate measurement is made on the ring oscillator speed. The speed of the ring oscillator circuit 1010 varies with PVTmeas(t). Therefore, this measurement yields a slowly varying binary number (called average loop speed in the aforementioned patents) that is a measure of the instantaneous PVT conditions in the IC in which the system is deployed. The computation circuits 1030(1) to 1030(Z) each perform binary multiplication based on PVTmeas(t) to convert the desired delay into the delay control signal that controls transistors in the delay circuit in each processing channel to create that delay. As a result, correction is made at the delay circuit for any tracking error caused by changing PVT conditions of the integrated circuit.

In addition, by using both P-type transistors and N-type transistors in the delay circuit, better tracking can be achieved with respect to the N-type and P-type transistors in the ring oscillator circuit 1010.

The speed at which one of the processing channels can operate is limited. To obtain higher frequencies, multiple processing channels are operated in parallel at different phases and combined later. For example, the output of the edge generation circuit 1050(2) may be coupled to the input of the combiner logic circuit 1060(1) in generating clock signal Clk1. These multiple processing channels are multiple parallel paths that need to be precisely aligned. There are some applications requiring a few picoseconds maximum discrepancy, and others (notably radio frequency applications) that may be even more stringent. Errors between processing channels can be measured and corrected for. The eight extra delay steps associated with the coarse control bit C8 of the delay circuit shown in FIG. 1 may be used to correct these errors. Eight steps provides a typical correction range of 10 ps while still presenting a full six-bit, 64-step delay range to edge generation circuits. These additional bits add very little to the area to the delay circuit and can be used, when needed, to cancel out a major jitter source.

The PVT tracking techniques described herein have a further application. One of the problems as semiconductor fabrication technologies go from 90 nm to 65 nm is a long term drift of P-type and N-type device thresholds. This is a different cause/effect than the PVT characteristics of an integrated circuit chip at the time it comes out of fabrication. The techniques described herein of passing a specific rising/falling edge through banks of sized P-type and N-type devices to track process, temperature, and voltage variations will also serve to track long term P-type and N-type threshold drifts.

In summary, a digitally programmable delay circuit is provided comprising a plurality of transistors connected in parallel with each other and to a line carrying a signal having an edge to be delayed, wherein one or more of the transistors are selected by a delay control signal to impose a delay amount to the edge, wherein the delay control signal is based on a desired delay amount and a measure of instantaneous process, voltage and temperature conditions of an integrated circuit in which the plurality of transistors are implemented.

In addition, a combination is provided in the integrated circuit of the digitally programmable delay circuit and a ring oscillator circuit that generates a plurality of uniquely phased oscillator transition signals from which a clock signal is generated; a comparator circuit coupled to the ring oscillator circuit that compares a speed of the ring oscillator circuit with a reference signal to generate a tracking value that is a measure of the instantaneous process, voltage and temperature conditions of the integrated circuit; and a computation circuit coupled to the comparator circuit that generates the delay control signal based on the tracking value and the desired delay amount.

Moreover, a method of delaying an edge of a signal is provided comprising coupling the edge to a plurality of transistors connected in parallel with each other; and activating one or more of the transistors to impose a delay amount to the edge, wherein the delay amount is based on a desired delay amount and a measure of instantaneous process, voltage and temperature conditions of an integrated circuit in which the plurality of transistors are implemented.

Further still, a digitally programmable delay circuit is provided comprising a first circuit stage and a second circuit stage connected in series with each other and to a line carrying a signal having an edge to be delayed. The first circuit stage comprises a plurality of transistors connected in parallel with each other, wherein one or more of the transistors are selected in response to a delay control signal to impose a relatively fine adjustable amount of delay to the edge. The second circuit stage comprises a plurality of transistors connected in parallel with each other, wherein one or more of the transistors are selected in response to the delay control signal to impose a relatively coarse adjustable amount of delay to the edge.

The above description is intended by way of example only.

What is claimed is:

1. A digitally programmable delay circuit comprising a plurality of transistors connected in parallel with each other and to a line carrying a signal having an edge to be delayed, wherein one or more of the transistors are selected by a delay control signal to impose a delay amount to the edge, wherein the plurality of transistors form a first sub-circuit and a second sub-circuit, the first sub-circuit comprising a plurality of P-type transistors connected in parallel with each other, some of the P-type transistors having different effective widths, and the second sub-circuit comprising a corresponding plurality of N-type transistors connected in parallel with each other, some of the N-type transistors having different effective widths, and further comprising an N-type transistor connected in parallel with the plurality of P-type transistors in the first sub-circuit, the N-type transistor discharging voltage across the plurality of P-type transistors in the first sub-circuit during a low portion of the signal, and a P-type transistor connected in parallel with the plurality of N-type transistors in the second sub-circuit, the P-type transistor discharging voltage across the plurality of N-type transistors in the second sub-circuit during a high portion of the signal, and wherein the first sub-circuit and the second sub-circuit are connected in series with each other so that one of the first and second sub-circuits delays the edge followed by the other of the first and second sub-circuits further delaying the edge, and wherein the delay control signal is based on a desired delay amount and a measure of instantaneous process, voltage and temperature conditions of an integrated circuit in which the plurality of transistors are implemented.

2. The circuit of claim 1, wherein each of the plurality of transistors, when selected, imposes a different delay amount to the signal.

3. The circuit of claim 1, wherein some of the plurality of transistors have a different effective width such that selection of a particular one or more of the transistors imposes a different delay amount on the edge.

4. The circuit of claim 3, wherein the plurality of transistors comprises a plurality of transistors of a first type connected in parallel with each other and a plurality of transistors of a second type connected in parallel with each other, and wherein some of the plurality of transistors of the first type impose a different delay amount on the edge when activated and some of the plurality of transistors of the second type impose a different delay amount on the edge when activated.

5. The circuit of claim 4, wherein one or more of the first type of transistors are selected and one or more of the second type of transistors are selected to impose a delay amount to the edge.

6. The circuit of claim 1, wherein a P-type transistor in the first sub-circuit and a corresponding N-type transistor in the second sub-circuit are selected together in response to the delay control signal.

7. The circuit of claim 1, wherein each of the plurality of P-type transistors in the first sub-circuit have different effective widths so as to span in increments a delay range, and each of the N-type transistors in the second sub-circuit have different effective widths so as to span in increments a delay range.

8. The circuit of claim 1, and further comprising a first capacitive load and a first switching transistor, wherein the first capacitive load is connected between a fixed potential and a first terminal of the first switching transistor and a second terminal of the first switching transistor being connected to a first commonly connected terminal of each of the plurality of P-type transistors in the first sub-circuit, the first switching transistor controlling connection of one or more of the plurality of P-type transistors that have been selected in the first sub-circuit to the line carrying the edge to be delayed, and a second capacitive load and a second switching transistor, wherein the second capacitive load is connected between a fixed potential and a first terminal of the second switching transistor and a second terminal of the second switching transistor being connected to a first commonly connected terminal of each of the plurality of N-type transistors in the second sub-circuit, the second switching transistor controlling connection of one or more of the plurality of N-type transistors that have been selected in the second sub-circuit to a line carrying the edge that has been delayed by the selected one or more of the P-type transistors in the first sub-circuit.

9. The circuit of claim 1, and further comprising a first capacitive load connected between a fixed potential and a first commonly connected terminal of each of the plurality of P-type transistors in the first sub-circuit, and a first switching transistor connected to a second commonly connected terminal of each of the plurality of P-type transistors, wherein the first switching transistor controls connection of one or more of the plurality of P-type transistors that have been selected in the first sub-circuit to a power rail, and a second capacitive load connected between a fixed potential and a first commonly connected terminal of each of the plurality of N-type transistors in the second sub-circuit, and a second switching transistor connected to a second commonly connected terminal of each of the plurality of N-type transistors, wherein the second switching transistor controls connection of one or more of the plurality of N-type transistors that have been selected in the second sub-circuit to a fixed potential.

10. The circuit of claim 1, wherein only one P-type transistor in the first sub-circuit and one corresponding N-type transistor in the second sub-circuit are selected and activated at any time.

11. The circuit of claim 10, and further comprising a selector circuit that is responsive to the delay control signal to generate transistor selection signals that select and activate one P-type transistor in the first sub-circuit and the corresponding N-type transistor in the second sub-circuit.

12. In combination in the integrated circuit, the digitally programmable delay circuit of claim 1, and further comprising:

a. a ring oscillator circuit that generates a plurality of uniquely phased oscillator transition signals from which a clock signal is generated;
 b. a comparator circuit coupled to the ring oscillator circuit that compares a speed of the ring oscillator circuit with a reference signal to generate a tracking value that is a measure of the instantaneous process, voltage and temperature conditions of the integrated circuit; and
 c. a computation circuit coupled to the comparator circuit that generates the delay control signal based on the tracking value and the desired delay amount.

13. In combination in an integrated circuit:

a digitally programmable delay circuit comprising a plurality of transistors connected in parallel with each other and to a line carrying a signal having an edge to be delayed, wherein one or more of the transistors are selected by a delay control signal to impose a delay amount to the edge, wherein the delay control signal is based on a desired delay amount and a measure of instantaneous process, voltage and temperature conditions of an integrated circuit in which the plurality of transistors are implemented;

a ring oscillator circuit that generates a plurality of uniquely phased oscillator transition signals from which a clock signal is generated;

a comparator circuit coupled to the ring oscillator circuit that compares a speed of the ring oscillator circuit with a reference signal to generate a tracking value that is a measure of the instantaneous process, voltage and temperature conditions of the integrated circuit;

a computation circuit coupled to the comparator circuit that generates the delay control signal based on the tracking value and the desired delay amount; and a capacitive load connected between the plurality of transistors and ground, wherein the capacitive load comprises an active capacitor having a gate, source and drain, and wherein a ratio of a gate capacitance to wire capacitance is set for matching tracking between the programmable delay circuit and the ring oscillator circuit.

14. In combination in an integrated circuit:

a digitally programmable delay circuit comprising a plurality of transistors connected in parallel with each other and to a line carrying a signal having an edge to be delayed, wherein one or more of the transistors are selected by a delay control signal to impose a delay amount to the edge, wherein the delay control signal is based on a desired delay amount and a measure of instantaneous process, voltage and temperature conditions of an integrated circuit in which the plurality of transistors are implemented;

a ring oscillator circuit that generates a plurality of uniquely phased oscillator transition signals from which a clock signal is generated;

a comparator circuit coupled to the ring oscillator circuit that compares a speed of the ring oscillator circuit with a reference signal to generate a tracking value that is a measure of the instantaneous process, voltage and temperature conditions of the integrated circuit;

a computation circuit coupled to the comparator circuit that generates the delay control signal based on the tracking value and the desired delay amount; and wherein the ring oscillator circuit comprises a plurality of transistors each having a source, gate and drain, and wherein a gate length of the plurality of ring oscillator circuit transistors and a gate length of the plurality of transistors in the digitally programmable delay circuit are set such that a relative gate length between the plurality of transistors in the digitally programmable delay circuit and the plurality of ring oscillator circuit transistors achieves a desired tracking between the digitally programmable delay circuit and the ring oscillator circuit.

15. The combination of claim 14, wherein the plurality of transistors in the digitally programmable delay circuit comprises a first sub-circuit having a plurality of P-type transistors and a second sub-circuit having a plurality of N-type transistors, wherein the first sub-circuit is connected in series with the second sub-circuit.

16. The combination of claim 15, wherein the computation circuit generates the delay control signal that causes selection of one or more P-type transistors in the first sub-circuit and a corresponding one or more N-type transistors in the second sub-circuit of the digitally programmable delay circuit.

17. The combination of claim 14, and further comprising a selector circuit that is coupled to receive as input the delay control signal, wherein the delay control signal comprises a digital selection code, wherein in response to the delay selection code the selector circuit selects and activates one or more of the plurality of transistors in the digitally programmable delay circuit.

* * * * *